United States Patent
Dorfman

(10) Patent No.: US 9,718,966 B2
(45) Date of Patent: Aug. 1, 2017

(54) POLYMER THICK FILM SILVER CONDUCTOR WITH INVERTED CURE PROFILE BEHAVIOR

(71) Applicant: E I DU PONT DE NEMOURS AND COMPANY, Wilmington, DE (US)

(72) Inventor: Jay Robert Dorfman, Durham, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 49 days.

(21) Appl. No.: 14/736,791

(22) Filed: Jun. 11, 2015

(65) Prior Publication Data

US 2016/0017156 A1   Jan. 21, 2016

Related U.S. Application Data

(60) Provisional application No. 62/140,664, filed on Mar. 31, 2015, provisional application No. 62/024,542, filed on Jul. 15, 2014.

(51) Int. Cl.
| | |
|---|---|
| *H01B 1/22* | (2006.01) |
| *C09D 5/24* | (2006.01) |
| *H05K 1/09* | (2006.01) |
| *C08K 3/08* | (2006.01) |
| *C09D 127/16* | (2006.01) |
| *C09D 11/52* | (2014.01) |

(52) U.S. Cl.
CPC ............... *C09D 5/24* (2013.01); *C08K 3/08* (2013.01); *C09D 11/52* (2013.01); *C09D 127/16* (2013.01); *H01B 1/22* (2013.01); *H05K 1/095* (2013.01); *C08K 2003/0806* (2013.01); *H05K 2201/015* (2013.01)

(58) Field of Classification Search
CPC ............... H01B 1/00; H01B 1/22; C09D 5/24
See application file for complete search history.

(56) References Cited

U.S. PATENT DOCUMENTS

| | | | | |
|---|---|---|---|---|
| 6,214,527 | B1 * | 4/2001 | Kosaka | G03F 7/0047 430/17 |
| 2014/0305923 | A1 * | 10/2014 | Dorfman | H05B 3/145 219/202 |

FOREIGN PATENT DOCUMENTS

| | | |
|---|---|---|
| EP | 1538180 A2 | 6/2005 |
| EP | 1538637 A1 | 6/2005 |

OTHER PUBLICATIONS

International Search Report and Written Opinion Dated Sep. 29, 2015 for International Patent Application No. PCT/US2015-039012.

* cited by examiner

Primary Examiner — Mark Kopec

(57) ABSTRACT

This invention is directed to a polymer thick film conductor composition that provides a better conductor when dried at 80° C. than when dried at 130° C., in contrast to typical PTF conductors. More specifically, the polymer thick film conductor may be used in applications where low temperature curing is required.

10 Claims, No Drawings

POLYMER THICK FILM SILVER CONDUCTOR WITH INVERTED CURE PROFILE BEHAVIOR

FIELD OF THE INVENTION

This invention is directed to a polymer thick film (PTF) conductor composition that performs better when dried at 80° C. than when dried at 130° C., in contrast to typical PTF conductors, More specifically, the polymer thick film conductor composition may be used in applications where low temperature curing is required.

BACKGROUND OF THE INVENTION

Conductive PTF circuits have long been used as electrical elements in low voltage circuitry. Although they have been used for years in these types of applications, the use of PTF silver conductors in applications involving curing at temperatures less 90° C. is not common. This is particularly important in circuits where a highly conductive silver composition is needed on base substrates that cannot withstand temperatures greater than 90° C. The typical substrates used are polyester and polycarbonate which can withstand 130° C. drying cycles. When a typical PTF conductor is dried at 130° C., it exhibits optimum properties such as low (15 mohm/sq/mil) resistivity and good adhesion to the substrate. When a typical PTF conductor is dried at 80° C., the resulting properties are inferior and not acceptable for functional circuitry. However, more and more applications are being developed which require the use of polyvinylidene difluoride (PVDF), polyvinyl chloride (PVC) or other such substrates which must not be exposed to temperatures greater than 90° C. One of the purposes of this invention is to deal with this issue and thus formulate a PTF conductor with excellent performance when dried at 80° C., such that the properties match a typical PTF conductor dried at 130° C.

SUMMARY OF THE INVENTION

This invention relates to a polymer thick film conductor composition comprising:
(a) 30-90 wt % silver powder; and
(b) 10-70 wt % organic medium comprising 10-60 wt % thermoplastic vinylidene difluoride/hexafluoro propylene copolymer resin dissolved in 40-90 wt % organic solvent consisting of triethyl phosphate, wherein the weight percent of the thermoplastic vinylidene difluoride/hexafluoro propylene copolymer resin and the triethyl phosphate organic solvent are based on the total weight of the organic medium;
wherein said silver powder is dispersed in said organic medium and wherein the weight percent of the silver powder and the organic medium are based on the total weight of the polymer thick film conductor composition.

DETAILED DESCRIPTION OF INVENTION

The invention relates to a polymer thick film conductor composition for use in low-temperature substrate electrical circuits. A layer of the polymer thick film conductor composition is printed and dried at 80° C. on the substrate so as to produce a functioning circuit. This polymer thick film conductor composition exhibits inverted cure behavior, i.e., it results in a lower resistivity when dried at 80° C. as compared to when dried at 130° C.

The substrates commonly used in polymer thick film circuits are polycarbonate (PC), polyester (PET) among others. PET is generally preferred since it can be processed at higher temperatures such as 130° C. However, for many applications, substrates such as polyvinyl chloride (PVC) and polyvinylidene difluoride (PVDF) are used and they can only be exposed to approximately 80° C. maximum temperature before they deform.

The polymer thick film (PTF) conductor composition is comprised of (i) silver powder dispersed in (ii) an organic medium comprising a polymer resin dissolved in an organic solvent consisting of triethyl phosphate. Additionally, powders and printing aids may be added to improve the composition. Herein, weight percent will be written as wt %.

A. Conductive Powder

In an embodiment, the conductive powders in the instant polymer thick film conductor composition are Ag conductor powders and may comprise Ag metal powder, alloys of Ag metal powder, Ag-coated copper powder or mixtures thereof. As used herein, "silver powder" and "metal powder" include all of the powders enumerated in the previous sentence. Various particle diameters and shapes of the metal powder are contemplated. In an embodiment, the conductive Ag powder may include silver particles of any shape, including particles that are spherical, in the form of flakes (rods, cones, plates), and mixtures thereof. In one embodiment, the conductive silver powder comprises particles selected from the group consisting of silver flakes, silver-coated copper particles and mixtures thereof. In an embodiment, the conductive silver powder comprises particles in the form of silver flakes. In another embodiment, the conductive silver powder comprises a mixture of particles of silver and silver-coated copper. The use of silver-coated copper particles results in increased resistivity but a lower cost than the use of only silver particles and this is useful in certain applications.

In an embodiment, the particle size distribution of the conductive powders may be 1 to 100 microns; in a further embodiment, 2-10 microns.

In an embodiment, the surface area/weight ratio of the silver particles may be in the range of 0.1-1.0 $m^2/g$.

Furthermore, it is known that small amounts of other metals may be added to silver conductor compositions to improve the properties of the conductor. Some examples of such metals include: gold, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof and others common in the art of thick film compositions. The additional metal(s) may comprise up to about 1.0 percent by weight of the total composition. As used herein, silver powder encompasses such additional metals.

In various embodiments, the silver powder is present at 30 to 90 wt %, 40 to 80 wt %, or 58 to 70 wt %, based on the total weight of the composition.

B. Organic Medium

The organic medium is comprised of a thermoplastic vinylidene difluoride/hexafluoro propylene (VF2/HFP) co-polymer resin dissolved in an organic solvent consisting of triethyl phosphate. Triethyl phosphate is a critical component of the instant polymer thick film conductor composition. Changing the solvent to something other than triethyl phosphate will render the composition ineffective in providing a suitable thick film conductor after an 80° C. drying. As always, the solvent used must solubilize the resin.

In various embodiments, the organic medium is present at 10 to 70 wt %, 20 to 60 wt %, or 30 to 42 wt %, based on the total weight of the composition.

In one embodiment, the thermoplastic VF2/HFP resin is 10-60 wt % and the triethyl phosphate is 40-90 wt % of the total weight of the organic medium. In another embodiment the thermoplastic VF2/HFP resin is 20-45 wt % and the triethyl phosphate is 55-80 wt % of the total weight of the organic medium and in still another embodiment the thermoplastic VF2/HFP resin is 25-35 wt % and the triethyl phosphate is 65-75 wt % of the total weight of the organic medium.

The polymer resin is typically added to the organic solvent by mechanical mixing to form the organic medium.

After the silver powder is dispersed in the organic medium, additional triethyl phosphate may be added to the polymer thick film conductor composition to adjust the viscosity of the composition. The amount of triethyl phosphate added for this purpose is included in the amounts of triethyl phosphate solvent indicated above.

Additional Powders

Various powders may be added to the PTF conductor composition to improve adhesion, modify the rheology and increase the low shear viscosity thereby improving the printability.

Application of the PTF Conductor Composition

The PTF conductor composition, also referred to as a "paste", is typically deposited on a substrate, such as PVDF or PVC, that is impermeable to gases and moisture. The substrate can also be a sheet of a composite material made up of a combination of plastic sheet with optional metallic or dielectric layers deposited thereupon.

The deposition of the PTF conductor composition is performed typically by screen printing, but other deposition techniques such as stencil printing, syringe dispensing or coating techniques can be utilized. In the case of screen-printing, the screen mesh size controls the thickness of the deposited thick film.

Generally, a thick film composition comprises a functional phase that imparts appropriate electrically functional properties to the composition. The functional phase comprises electrically functional powders dispersed in an organic medium that acts as a carrier for the functional phase. Generally, the composition is fired to burn out both the polymer and the solvent of the organic medium and to impart the electrically functional properties. However, in the case of a polymer thick film, the polymer portion of the organic medium remains as an integral part of the composition after drying.

The PTF conductor composition is processed for a time and at a temperature necessary to remove all solvent. For example, the deposited thick film is dried by exposure to heat at 80° C. for typically 5 min.

Circuit Construction

Substrates such as polyvinyl chloride and polyvinylidene difluoride which can only be exposed to approximately 80° C. maximum temperature are suitable for use with the instant PTF conductor composition. The PTF conductor composition is printed and dried as per the conditions described above. Several layers can be printed and dried.

The base substrate used in the Examples and Comparative Experiments was PET so that drying could be carried out at 80° C. and 130° C. to show the advantage of the instant PTF conductor composition.

EXAMPLES AND COMPARATIVE EXPERIMENTS

Example 1

The PTF conductor composition was prepared in the following manner. 34.31 wt % of the organic medium was used and was prepared by mixing 32.5 wt % vinylidene difluoride/hexafluoro propylene copolymer resin, ADS2 (Arkema, Inc. King of Prussia, Pa.), with 67.5 wt % triethyl phosphate (Eastman Chemicals, Kingsport, Tenn.) organic solvent. The wt % of the resin and the triethyl phosphate are based on the total weight of the organic medium. The molecular weight of the resin was approximately 20,000. This mixture was heated at 90° C. for 1-2 hours to dissolve all the resin. 63.72 wt % of a flake silver powder with an average particle size of approximately 5 microns was added. Finally, 1.97 wt % of triethyl phosphate was added to reduce the viscosity of the paste. The wt % of the vinylidene difluoride/hexafluoro propylene copolymer resin, the organic medium and the added triethyl phosphate were based upon the total weight of the PTF conductor composition.

This composition was mixed for 30 minutes on a planetary mixer, and then subjected to several passes on the three roll-mill to provide the PTF conductor composition.

A circuit was then fabricated as follows. On a 5 mil thick PET substrate, the PTF conductor composition was used to print a pattern of a series of serpentine silver lines using a 280 mesh stainless steel screen. The patterned lines were dried at 80° C. for 5 min. in a forced air box oven. The circuit was inspected and tested for resistivity and adhesion. Excellent resistivity (15 mohm/sq/mil) and adhesion (no removal from substrate using ASTM Tape test) was found. Results are shown in Table I.

Comparative Experiment A

A circuit was produced exactly as described in Example 1. The only difference was that the conductive pattern was dried at 130° C. for 10 min. As can be seen in Table 1, the properties of the PTF silver composition were worse when dried at 130° C. as compared to those when dried at 80° C. Results are shown in Table I.

Comparative Experiment B

A circuit was produced exactly as described in Example 1. The only difference was that dibasic esters were used as the organic solvent instead of triethyl phosphate. Results of drying at 130° C. vs 80° C. were typical of a PTF conductor (better performance at higher temperatures). The excellent performance at 80° C. was not seen. Results are shown in Table I.

Comparative Experiment C

A circuit was produced exactly as described in Example 1. The only difference was that a commercial silver conductor paste, DuPont 5025 (DuPont Co., Wilmington, Del.) was used to form the circuit. Results of drying at 130° C. vs 80° C. were typical of a PTF conductor (better performance at higher temperatures). The excellent performance at 80° C. was not seen. Results are shown in Table I.

Example 2

A circuit was produced exactly as described in Example 1 with the exception that the composition used here had an approximate 50/50 blend of flake silver and silver-coated copper (Ames Corporation; 3 µm average particle size). As can be seen in Table 1, the resistivity of the PTF silver composition was higher when dried at 130° C. as compared to that when dried at 80° C. Excellent adhesion was found. Results are shown in Table I.

TABLE I

| Composition | Resistivity (Drying Temp. 80° C.) | Resistivity (Drying Temp 130° C.) | Adhesion PET 0 = Worst; 5 = Best |
|---|---|---|---|
| Example 1 | 15.5 mohm/sq/mil | | 4 |
| Comparative Experiment A | | 40.2 mohm/sq/mil | 3 |
| Comparative Experiment B | 50 mohm/sq/mil | 16 mohm/sq/mil | 4 |
| Comparative Experiment C | 45 mohm/sq/mil | 13 mohm/sq/mil | 5 |
| Example 2 | 66 mohm/sq/mil | 75 mohm/sq/mil | 5 |

What is claimed is:

1. A polymer thick film conductor composition, comprising:
   (a) 30-90 wt % of a conductive powder comprising silver powder and up to 1 wt % of the total composition additional metal powder or conductive carbon powder; and
   (b) 10-70 wt % organic medium comprising 10-60 wt % thermoplastic vinylidene difluoride/hexafluoro propylene copolymer resin dissolved in 40-90 wt % organic solvent consisting of triethyl phosphate, wherein the weight percent of said thermoplastic vinylidene difluoride/hexafluoro propylene copolymer resin and said triethyl phosphate organic solvent are based on the total weight of said organic medium;
wherein said conductive powder is dispersed in said organic medium, wherein the weight percent of said conductive powder and said organic medium are based on the total weight of said polymer thick film conductor composition, and wherein a polymer thick film conductor can be formed by drying the polymer thick film conductor composition at a temperature less than 90° C.

2. The polymer thick film conductor composition of claim 1, said silver powder comprising particles selected from the group consisting of silver flakes, silver-coated copper particles and mixtures thereof, wherein a polymer thick film conductor can be formed by drying the polymer thick film conductor composition at a temperature of 80° C.

3. The polymer thick film conductor composition of claim 1, said silver powder comprising silver flakes, wherein a polymer thick film conductor can be formed by drying the polymer thick film conductor composition at a temperature of 80° C.

4. The polymer thick film conductor composition of claim 1, said silver powder comprising a mixture of silver flakes and silver-coated copper particles, wherein a polymer thick film conductor can be formed by drying the polymer thick film conductor composition at a temperature of 80° C.

5. The polymer thick film conductor composition of claim 1, comprising:
   (a) 40-80 wt % conductive powder; and
   (b) 20-60 wt % organic medium, wherein a polymer thick film conductor can be formed by drying the polymer thick film conductor composition at a temperature of 80° C.

6. The polymer thick film conductor composition of claim 5, comprising:
   (a) 58-70 wt % conductive powder; and
   (b) 30-42 wt % organic medium, wherein a polymer thick film conductor can be formed by drying the polymer thick film conductor composition at a temperature of 80° C.

7. The polymer thick film conductor composition of claim 5, said silver powder comprising particles selected from the group consisting of silver flakes, silver-coated copper particles and mixtures thereof.

8. The polymer thick film conductor composition of claim 1, said organic medium comprising 20-45 wt % thermoplastic vinylidene difluoride/hexafluoro propylene copolymer resin dissolved in 55-80 wt % organic solvent consisting of triethyl phosphate, wherein the weight percent of said thermoplastic vinylidene difluoride/hexafluoro propylene copolymer resin and said triethyl phosphate organic solvent are based on the total weight of said organic medium.

9. The polymer thick film conductor composition of claim 8, said organic medium comprising 25-35 wt % thermoplastic vinylidene difluoride/hexafluoro propylene copolymer resin dissolved in 65-75 wt % organic solvent consisting of triethyl phosphate, wherein the weight percent of said thermoplastic vinylidene difluoride/hexafluoro propylene copolymer resin and said triethyl phosphate organic solvent are based on the total weight of said organic medium.

10. The polymer thick film conductor composition of claim 8, said silver powder comprising particles selected from the group consisting of silver flakes, silver-coated copper particles and mixtures thereof.

* * * * *